United States Patent
Ishito

(10) Patent No.: US 11,092,887 B2
(45) Date of Patent: Aug. 17, 2021

(54) SUPPORTING FRAME FOR PELLICLES, PELLICLE, AND METHOD FOR PRODUCING SAME

(71) Applicant: NIPPON LIGHT METAL COMPANY, LTD., Tokyo (JP)

(72) Inventor: Nobuyuki Ishito, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 252 days.

(21) Appl. No.: 16/334,636

(22) PCT Filed: Aug. 29, 2017

(86) PCT No.: PCT/JP2017/030944

§ 371 (c)(1),
(2) Date: Mar. 19, 2019

(87) PCT Pub. No.: WO2018/055995

PCT Pub. Date: Mar. 29, 2018

(65) Prior Publication Data

US 2021/0096457 A1    Apr. 1, 2021

(30) Foreign Application Priority Data

Sep. 20, 2016  (JP) .............................. JP2016-182625

(51) Int. Cl.
*G03F 1/64*    (2012.01)

(52) U.S. Cl.
CPC ..................................... *G03F 1/64* (2013.01)

(58) Field of Classification Search
CPC ..................................... G03F 1/62; G03F 1/64
USPC ............................................................ 430/5
See application file for complete search history.

(56) References Cited

U.S. PATENT DOCUMENTS

| | | | | |
|---|---|---|---|---|
| 6,475,575 | B1 * | 11/2002 | Ikuta | ........................ G03F 1/62 |
| | | | | 428/14 |
| 2020/0264505 | A1 * | 8/2020 | Yoo | ........................... G03F 1/64 |

* cited by examiner

*Primary Examiner* — Christopher G Young
(74) *Attorney, Agent, or Firm* — Rankin, Hill & Clark LLP

(57) ABSTRACT

Provided are: a support frame (1) for pellicle that has both low dust generation property and high light resistance, and further has an ion elution amount which is reduced to the utmost limit to an extent that haze is not generated even when a short wavelength laser is used for an exposure light source, a pellicle (8) using the support frame for pellicle, and a method for efficiently manufacturing the support frame for pellicle. A support frame for pellicle which comprises a frame member (2) comprising aluminum or aluminum alloy, an anodized film (4) formed on the surface of the frame member, and a fluororesin coating layer (6) formed on the surface of the anodized film.

9 Claims, 2 Drawing Sheets

SUPPORTING FRAME FOR PELLICLES, PELLICLE, AND METHOD FOR PRODUCING SAME

TECHNICAL FIELD

The present invention relates to a support frame for pellicle which can prevent adhesion of foreign matters to a photomask or a reticle used in a lithography process in the manufacturing of a semiconductor device such as an LSI or an ultra LSI and a liquid crystal panel, and a pellicle and a method for manufacturing the same. More specifically, the present invention relates to a support frame for pellicle that an ion elution amount is reduced to the utmost limit, and a pellicle and a method for manufacturing the same.

PRIOR ARTS

On the semiconductor device such as the LSI or the ultra LSI and the liquid crystal panel, a pattern can be formed by irradiating light to a semiconductor wafer or an original plate for liquid crystal (pattern formation by lithography). Here, in the case of using an photomask to which dust adheres, since the dust absorbs and/or inverts the light, the pattern is not transferred satisfactorily (for example, distortion of the pattern or ambiguity of the edge). As a result, the quality and appearance of the semiconductor device and the liquid crystal panel are impaired, which results in decrease in performance and manufacturing yield.

For this reason, the lithography process is usually performed in a clean room, but, since adhesion of dust to the photomask cannot be completely prevented even under such environment, usually a pellicle for protecting from dust is provided on the surface of the photomask. Pellicle is composed of a pellicle frame and a pellicle film stretched over the pellicle frame and is placed so as to surround a pattern area formed on the surface of the photomask. When the focal point is set on the pattern of the photomask at the time of lithography, even if dust adheres to the pellicle film, the dust will not affect the transfer.

Recently, the pattern of the LSI has been rapidly advanced to fineness, and accordingly, a wavelength of the exposure light source has been shortened. Specifically, the wavelength has transited from g-line (wavelength: 436 nm) and i-line (wavelength: 365 nm) of a mercury lamp to KrF excimer laser (wavelength: 248 nm), ArF excimer laser (wavelength: 193 nm), F2 excimer laser (wavelength: 157 nm) and the like.

Since these short wavelength exposure light sources have high output and high energy of light, when an inorganic acid such as sulfuric acid or phosphoric acid remains on the anodized film formed on the surface of the aluminum material which forms the pellicle, there is a problem that a reaction product (haze) such as ammonium sulfate which is produced by reacting with a residual basic substance such as ammonia, and the reaction product causes clouding in the pellicle, which affects the pattern transferred image.

With respect to the problem, for example, Patent Literature 1 (JP 2010-237282 A) discloses a method for manufacturing a support frame for pellicle which is used as a pellicle having an optical thin film body. The support frame is formed by an aluminum material including aluminum or aluminum alloy, and in the method, an anodized film is formed on a surface of the aluminum material by anodizing treatment with an alkaline aqueous solution containing tartaric acid, and the anodized film is subjected to dyeing treatment with an organic dye, and then is subjected to sealing treatment by steam to obtain a support frame for pellicle.

In the method for manufacturing the support frame for pellicle described in the above Patent Literature 1, by using the alkaline aqueous solution containing tartaric acid to anodize the aluminum material without using sulfuric acid which is the maximum causative substance of haze, it is said that there can be obtained a support frame for pellicle which can reduce the generation of haze as much as possible while having excellent corrosion resistance and durability.

In addition, Patent Literature 2 (JP H07-43892 A) discloses a pellicle characterized in that a side surface or an entire surface of a pellicle frame is coated with a paint by an electrodeposition coating method.

In the pellicle described in Patent Literature 2, since the side surface or the entire surface of the pellicle frame is coated with the paint by the electrodeposition coating method, it is said that the coating film is not uneven like the alumite layer or porous, but is uniform and smooth, and thus, it is possible to completely prevent dust generation due to transportation and movement of the pellicle.

CITATION LIST

Patent Literature

Patent Literature 1: JP 2010-237282 A
Patent Literature 2: JP H07-43892 A

SUMMARY OF INVENTION

Technical Problem

However, even in the support frame for pellicle obtained according to the manufacturing method of the support frame for pellicle described in Patent Literature 1, it is impossible to completely inhibit the elution of ions, and with regard to the formation of a fine pattern which is required in the recent semiconductor manufacturing and the like, further reduction of ion elution amount is required.

Also with regard to the pellicle described in Patent Literature 2, it is necessary to add anions such as acetic acid and lactic acid for pH adjustment or the like in the manufacturing process. Since the anion remains in the coating film due to the addition, there is a limit to the reduction of the ion elution amount as the whole of the pellicle.

Considering the above problems in the prior arts, an object of the present invention is to provide a support frame for pellicle that has both low dust generation property and high light resistance, and further has an ion elution amount which is reduced to the utmost limit to an extent that haze is not generated even when a short wavelength laser is used for an exposure light source, a pellicle using the support frame for pellicle, and a method for efficiently manufacturing the support frame for pellicle.

Solution to Problem

As a result of extensive study with respect to the support frame for pellicle, a pellicle using the support frame for pellicle, and a method for efficiently manufacturing the support frame for pellicle in order to achieve the above object, the present inventors have found that formation of a fluororesin coating layer on the outermost surface of the support frame for pellicle is extremely effective, the present invention has been completed.

Namely, the present invention provides a support frame for pellicle which comprises:

a frame member comprising aluminum or aluminum alloy and a fluororesin coating layer formed on the surface of the frame member.

The fluororesin coating layer formed on the surface of the frame member is a thermoplastic polymer composed of fluorine elements and a carbon chain and since the fluroresin coating layer has both excellent properties of heat resistance and difficult adhesion, it is possible to extremely effectively suppress the generation of dust and the elution of ions.

Further, in the support frame for pellicle of the present invention, it is preferable to include the frame member, an anodized film formed on the surface of the frame member, and the fluororesin coating layer formed on the surface of the anodized film.

By forming the fluororesin coating layer on the surface of the anodized film having reduced ion elution amount, the elution amount of the anion can be effectively suppressed. In addition, as mentioned above, the fluororesin coating layer is a thermoplastic polymer composed of fluorine elements and a carbon chain and since the fluroresin coating layer has both excellent properties of heat resistance and difficult adhesion.

In the support frame for pellicle of the present invention, it is preferable that a lightness index *L value is 60 or less. When the lightness index *L value (lightness index by Hunter's color difference formula) of the support frame for pellicle is 60 or less by blackening, it is easy to prevent scattering of exposure light and to perform a foreign particle non-adhesion inspection before use.

For blackening of the support frame for pellicle, for example, though there can be used dyeing, pigmentation, natural coloring, electrolytic coloring or the like, in the case of using an organic dye, when high energy light is irradiated on the support frame for pellicle, there is a possibility that color tone change and discoloration may occur due to chemical change of the organic dye. Therefore, from the viewpoint of obtaining light resistance, it is preferable to use the pigmentation, natural coloring, electrolytic coloring and the like.

Furthermore, in the support frame for pellicle of the present invention, it is preferable that, in ion elution test for measuring concentration of an ion eluted by immersing the frame in pure water at 80° C. for 4 hours, elution concentration of acetate ion to 100 ml of pure water per 100 cm$^2$ of the surface area is 0.2 ppm or less, elution concentration of formate ion is 0.2 ppm or less, elution concentration of oxalate ion is 0.2 ppm or less, elution concentration of sulfate ion is 0.1 ppm or less, elution concentration of nitrate ion is 0.2 ppm or less, elution concentration of nitrite ion is 0.2 ppm or less, elution concentration of chlorine ion is 0.2 ppm or less, elution concentration of phosphate ion is 0.1 ppm or less, and elution concentration of ammonium ion is 0.1 ppm or less. By inhibiting the ion elution amount of the support frame for pellicle to these values, the haze generation during lithography can be substantially completely suppressed.

Further, the present invention also provides a method for manufacturing a support frame for pellicle, which comprises:

a first step for subjecting a frame member comprising aluminum or aluminum alloy to an anodizing treatment, and a second step for applying a fluororesin coating to the surface of an anodized film formed by the anodizing treatment.

In the manufacturing method of the support frame for pellicle of the present invention, the support frame can be manufactured by subjecting the frame member to the anodizing treatment and further subjecting to the fluorine resin coating treatment. More specifically, the fluororesin coating layer can be formed by coating or impregnating the fluororesin paint on the surface of the support frame for pellicle and stabilizing, followed by subjecting to baking treatment at an appropriate temperature. It is desirable to use a spray coating method for the fluororesin coating treatment. Further, when subjecting primer treatment between the anodizing treatment and the fluororesin coating treatment, it is possible to improve their adhesion. However, at the time when a short wavelength laser or the like is irradiated, since the primer is deteriorated easier than the fluororesin, when the primer is not formed, it is possible to suppress the generation of contamination due to the primer deterioration.

In the method of manufacturing the support frame for pellicle of the present invention, it is preferable to further include a coloring step for adjusting a lightness index *L value by at least one of pigmentation, natural coloring and electrolytic coloring. When lowering the lightness index *L value by the coloring step, it is possible to obtain the support frame for pellicle which can easily prevent scattering of exposure light and perform a foreign particle non-adhesion inspection before use, and the like. Here, from the viewpoints of prevention of scattering of exposure light and performing of the foreign particle non-adhesion inspection before use, it is preferable to adjust the lightness index *L value to 60 or less by blackening.

The present invention also provides a pellicle which includes:

the support frame for pellicle of the present invention, and a pellicle film supported by the support frame for pellicle.

Since the support frame for pellicle of the present invention has both low dust generation property and high light resistance, and further has an ion elution amount which is reduced to the utmost limit, the pellicle of the present invention using the support frame for pellicle of the present invention, it can be suitably used for lithography using a short wavelength laser as an exposure light source.

Effects of the Invention

According to the present invention, it is possible to provide a support frame for pellicle that has both low dust generation property and high light resistance, and further has an ion elution amount which is reduced to the utmost limit to an extent that haze is not generated even when a short wavelength laser is used for an exposure light source, a pellicle using the support frame for pellicle, and a method for efficiently manufacturing the support frame for pellicle.

EMBODIMENTS FOR ACHIEVING THE INVENTION

Hereinafter, representative embodiments of the support frame for pellicle, the pellicle and the manufacturing method thereof according to the present invention will be described in detail with reference to the drawings, but the present invention is not limited to only these examples. In the following description, the same or equivalent parts are denoted by the same numerals, and there is a case that redundant explanation may be omitted. In addition, since the drawings are for conceptually explaining the present invention, dimensions of the respective constituent elements expressed and ratios thereof may be different from actual ones.

1. Support Frame for Pellicle

Figure 1:
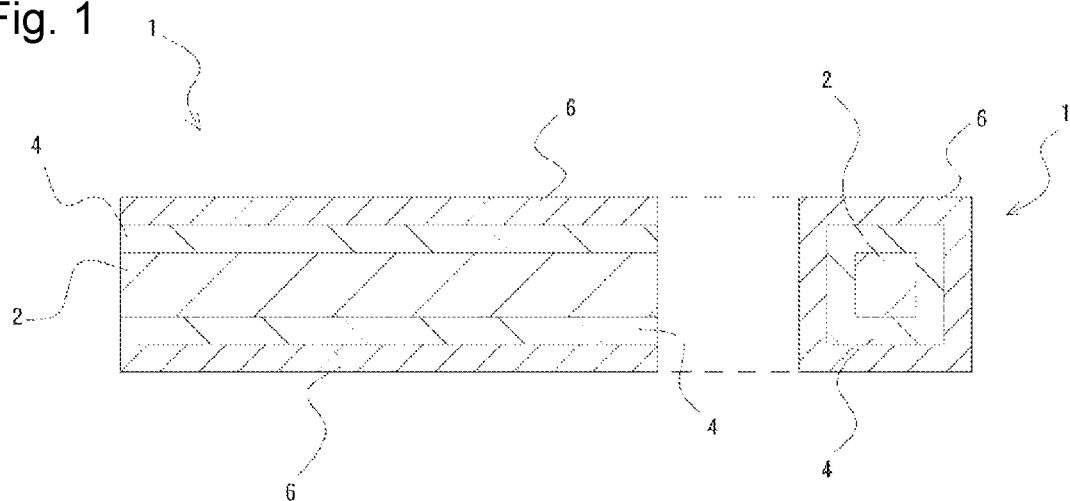
FIG. 1 is a schematic cross-sectional view showing the support frame for pellicle of the present invention.

FIG. 1 shows a schematic cross-sectional view of the support frame for pellicle of the present invention. In the support frame 1 for pellicle, an anodized film 4 is formed on the surface of the frame member 2, and a fluororesin coating layer 6 is formed on the surface of the anodized film 4.

The frame member 2 is made of aluminum or aluminum alloy, and various conventionally known aluminum or aluminum alloys can be used as the material. Examples of the material include aluminums of 1000 series, aluminum alloys of 3000 series, aluminum alloys of 5000 series, aluminum alloys of 6000 series, aluminum alloys of 7000 series, Al—Ca alloys, and the like.

Examples of the aluminum of 1000 series include A1050, A1050A, A1070, A1080, A1085, A1100, A1200, A1N00 and A1N30 described in the JIS standard, examples of the aluminum alloy of 3000 series include A3003, A3103, A3203, A3004, A3104, A3005 and A3105 described in the JIS standard, examples of the aluminum alloy of 5000 series include A5005, A5N01, A5021, A5N02 and A5042 described in the JIS standard, examples of the aluminum alloy of 6000 series include A6101, A6003, A6005, A6N01, A6151 and A6063 described in the JIS standard, and examples of the aluminum alloy of 7000 series include A7001, A7003, A7005, A7010, A7020, A7049, A7050, A7075, A7090, A7091, A7178, A7475 and A7N01.

Further, the Al—Ca alloy is not particularly limited as long as the effects of the present invention are not impaired, and various conventionally known Al—Ca alloys can be used, but, according to the crystal structure, crystal particle size, shape control, and the like of the $Al_4Ca$ crystal, it is preferable to use an Al—Ca alloy that achieves both the low Young's modulus and the excellent rolling processability.

In addition, the method for manufacturing the frame member 2 is not particularly limited, and various conventionally known methods for manufacturing aluminum or aluminum alloy members can be used. As the frame member 2, for example, one obtained by processing a powder sintered body as a hot extruded material, or one obtained by subjecting an aluminum alloy ingot to plastic-working can be used. Further, heat treatment may be appropriately performed, if necessary.

The shape of the support frame 1 for pellicle is not particularly limited as long as the effects of the present invention are not impaired and can be various conventionally known shapes according to the shape of the photomask, but, in general, the plane shape of the support frame 1 for pellicle is a ring shape, a rectangular shape or a square shape and has a size and shape to cover the circuit pattern portion provided on the photomask. In addition, the support frame 1 for pellicle may be provided with an air pressure adjustment vent, a dust removal filter for the vent, jig holes, and the like.

The height (thickness) of the support frame 1 for pellicle is preferably 1 to 10 mm, more preferably 2 to 7 mm, and most preferably 3 to 6 mm. By setting the height (thickness) of the support frame 1 for pellicle to these values, the distortion of the support frame 1 for pellicle can be inhibited, and good handling property can be ensured.

The cross-sectional shape of the support frame 1 for pellicle is not particularly limited as long as the effects of the present invention are not impaired and can be various conventionally known shapes, but it is preferable that the cross-sectional shape is a quadrilateral in which the upper side and the lower side are parallel. There are required a width for mounting the pellicle film is required on the upper side of the support frame 1 for pellicle and a width for adhering to the photomask by providing the adhesive layer for pressure sensitive adhesion on the lower side. For this reason, the width of the upper side and the lower side of the support frame 1 for pellicle is preferably about 1 to 3 mm.

The flatness of the support frame 1 for pellicle is preferably smaller than or equal to 20 μm, more preferably smaller than or equal to 10 μm. By improving the flatness of the support frame 1 for pellicle, it is possible to reduce the distortion amount of the support frame 1 for pellicle when the pellicle is attached to the photomask. The flatness of the support frame 1 for pellicle is calculated by calculating a virtual plane by measuring the height at a total of 8 points including 4 corners of the support frame 1 for pellicle and 4 central points of the four sides, and then calculating from the difference obtained by subtracting the lowest point from the highest point among the distances of each point.

The film quality and the like of the anodized film 4 are not particularly limited as long as the effects of the present invention are not impaired and various conventionally known anodized films can be used, but preferable is one that is formed by anodizing the frame member 2 in an alkaline bath. For example, when an anodizing treatment is performed by using a sulfuric acid bath, an inorganic acid such as sulfuric acid or phosphoric acid remains on the anodized film 4 on the surface of the aluminum member (frame member 2) due to the bath, and this acid reacts with a basic substance such as ammonia existing in the exposure atmosphere to produce a reaction product (haze) such as ammonium sulfate, and then the reaction product (haze) causes clouding in the pellicle to affect the pattern transferred image. On the other hand, by using the alkaline bath for the anodizing treatment, it is possible to prevent the remaining of the inorganic acid which forms the reaction product (haze).

The thickness of the anodized film 4 is not particularly limited as long as the effects of the present invention are not impaired, but it is preferably 1 to 15 μm. When the film thickness is 1 μm or more, a homogeneous anodized film 4 can be formed, and when being 15 μm or less, it is possible to suppress the decrease in strength of the anodized film 4.

The fluororesin coating layer 6 formed on the surface of the anodized film 4 is a thermoplastic polymer composed of fluorine elements and a carbon chain and since the fluroresin coating layer has both excellent properties of heat resistance and difficult adhesion, it is possible to extremely effectively suppress the generation of dust and the elution of ions.

In addition, since the fluororesin coating layer 6 is formed by spray-coating of a fluororesin paint, an anion (negative ion) is not particularly introduced during the process of the formation, and the anion (negative ion) remained in the fluororesin coating layer 6 can be suppressed. As the paint used for fluororesin coating, a paint which contains any one of polytetrafluoroethylene (PTFE), polychlorotrifluoroethylene (PCTFE, PFA), polyvinylidene fluoride (PVDF), polyvinyl fluoride (PVF), perfluoroethylene-propylene copolymer (PFEP), copolymer of tetrafluoroethylene and ethylene (ETFE), a copolymer of chlorotrifluoroethylene and ethylene (ECTFE) can be suitably used.

In the support frame 1 for pellicle, the lightness index *L value is preferably 60 or less. When the lightness index *L value (lightness index by Hunter's color difference formula) of the support frame 1 for pellicle is 60 or less by blackening, it is easy to prevent scattering of exposure light and to perform a foreign particle non-adhesion inspection before use.

For blackening of the support frame 1 for pellicle, for example, though there can be used dyeing, pigmentation, natural coloring, electrolytic coloring or the like, in the case of using an organic dye, when high energy light is irradiated on the support frame for pellicle, there is a possibility that color tone change and discoloration may occur due to chemical change of the organic dye. Therefore, from the viewpoint of obtaining light resistance, it is preferable to use the pigmentation, natural coloring, electrolytic coloring and the like.

As described above, since the anions (negative ions) is prevented from remaining in the anodized film 4 and the fluororesin coating layer 6, the elution of the anions (negative ions) from the pellicle support frame 1 for pellicle is extremely small. Here, it is preferable that, in the ion elution test for measuring a concentration of an ion eluted by immersing the support frame 1 for pellicle in pure water at 80° C. for 4 hours, an elution concentration of acetate ion to 100 ml of pure water per 100 $cm^2$ of the surface area is 0.2 ppm or less, an elution concentration of formate ion is 0.2 ppm or less, an elution concentration of oxalate ion is 0.2 ppm or less, an elution concentration of sulfate ion is 0.1 ppm or less, an elution concentration of nitrate ion is 0.2 ppm or less, an elution concentration of nitrite ion is 0.2 ppm or less, an elution concentration of chlorine ion is 0.2 ppm or less, an elution concentration of phosphate ion is 0.1 ppm or less, and an elution concentration of ammonium ion is 0.1 ppm or less. By inhibiting the ion elution amount of the support frame 1 for pellicle to these values, the haze generation during lithography can be substantially completely suppressed. Particularly, by controlling the elution amounts of acetate ion, formate ion, sulfate ion, oxalate ion and nitrite ion, the generation of the haze can be lowered to the utmost.

2. Method for Manufacturing Support Frame for Pellicle

The method for manufacturing the support frame 1 for pellicle of the present invention is to subjecting the frame member 2 comprising aluminum or the aluminum alloy to the fluororesin coating treatment, and includes a first step (S 01) for subjecting the frame member 2 comprising aluminum or the aluminum alloy to an anodizing treatment, and a second step (S 02) for applying the fluororesin coating to the surface of an anodized film 4 formed by the anodizing treatment. In the following, each step will be described in detail.

(1) First Step (01: Anodizing Treatment)

The first step (S 01) is a step for subjecting the frame member 2 comprising aluminum or the aluminum alloy to the anodizing treatment to form the anodized film 4. The conditions of the anodizing treatment are not particularly limited as long as the effects of the present invention are not impaired, and various conventionally known anodizing treatments can be used, but it is preferable to perform the treatment in the alkaline bath.

With respect to the anodizing treatment, more specifically, it is preferable that the anodizing treatment is performed in i) an inorganic alkaline bath which contains one or more inorganic alkaline components selected from the group consisting of sodium hydroxide, potassium hydroxide, lithium hydroxide, calcium hydroxide, strontium hydroxide and rubidium hydroxide, or in ii) an alkaline mixed bath which contains one or more organic acids selected from the group consisting of tartaric acid, citric acid, oxalic acid and salicylic acid, and one or more inorganic alkaline components selected from the group consisting of sodium hydroxide, potassium hydroxide, lithium hydroxide, calcium hydroxide, strontium hydroxide and rubidium hydroxide.

Here, in the case of using the inorganic alkaline bath containing the inorganic alkaline component of i) as the alkaline bath, since any acid component is not contained, there is almost no case that an intermetallic compound other than Al is dissolved during anodizing. With respect to the inorganic alkaline component, from the viewpoint of versatility, it is preferable to use sodium hydroxide or potassium hydroxide. Furthermore, considering the formation rate of the anodized film and the like, the pH of the alkaline aqueous solution (inorganic alkaline bath) is preferably 12 to 14, more preferably 12.5 to 13.5.

The treatment conditions for the anodizing treatment when the inorganic alkaline bath is used may be appropriately adjusted according to the film thickness, characteristics, processing time, and the like of the anodized film 4 to be formed, and the voltage is 0.5 to 20 V, more preferably 1 to 20 V, and most preferably 3 to 17 V. By performing the anodized film treatment in a relatively low voltage range as described above, depending on the material of the frame member 2 (for example, in the case where an intermetallic compound such as $MgZn_2$ exists in the Al base material), a blackened anodized film can be obtained. On the other hand, by setting the voltage to 1 V or more, it is possible to stably form the anodized film 4.

Further, when subjecting the anodizing treatment, the bath temperature is preferably 0 to 20° C., more preferably 0 to 15° C., and most preferably 5 to 10° C. When the bath temperature is lower than 0° C., not only the formation rate of the coating film is slow and the efficiency is not good, on the other hand, when the temperature is higher than 20° C., since the rate of dissolution of the coating film is increased to need time, and in addition thereto, there is a possibility that appearance such as powder blowing may occur. The treatment time of the anodizing treatment is preferably 2 to 120 minutes, more preferably 5 to 90 minutes.

As described above, in the case i) where the inorganic alkaline bath is used, since the organic acid or inorganic acid is not contained in the anodizing bath, not only management of the electrolytic solution is easy, but also there are no components decomposed by irradiation of various lasers. As a result, it is possible to give excellent light resistance to the support frame 1 for pellicle and to suppress generation of the haze or the like to the utmost.

On the other hand, in the case ii) where the alkaline mixed bath which contains the organic acid and the inorganic alkaline component is used, in addition to blackening with an intermetallic compound such as $MgZn_2$, the coloring occurs by taking the organic component into the anodized film. From the viewpoints of light resistance, occurrence of haze and the like, it is preferable to use the aforementioned organic acid as the target organic acid.

As the tartaric acid, tartaric acid salts such as sodium tartrate, potassium tartrate, potassium sodium tartrate and ammonium tartrate can be suitably used. The concentration of the tartaric acid salt is preferably 13 to 200 g/L, and more preferably 25 to 150 g/L. When the concentration of the tartaric acid salt is lower than 13 g/L, it is difficult to form the anodized film, and when more than 200 g/L, there is a possibility that the tartaric acid salt precipitates during the anodizing treatment. The pH of the alkaline aqueous solution (alkaline mixed bath) containing the tartaric acid salt and the inorganic alkaline component is preferably 12 to 14, more preferably 12.5 to 13.0.

Further, as the citric acid, citric acid salts such as sodium citrate, potassium citrate, lithium citrate and ammonium citrate can be suitably used. The concentration of the citric acid salt is preferably 20 to 300 g/L, and more preferably 50 to 200 g/L. The pH of the alkaline aqueous solution (alkaline mixed bath) containing the citric acid salt and the inorganic alkaline component is preferably 12 to 14, more preferably 12.5 to 13.0.

Further, as the oxalic acid, oxalic acid salts such as sodium oxalate, potassium oxalate and ammonium oxalate can be suitably used. The concentration of the oxalic acid salt is preferably 3 to 350 g/L, and more preferably 10 to 300 g/L. The pH of the alkaline aqueous solution (alkaline mixed bath) containing the oxalic acid salt and the inorganic alkaline component is preferably 12 to 14, more preferably 12.5 to 13.5.

Furthermore, as the salicylic acid, salicylic acid salts such as sodium salicylate, potassium salicylate and ammonium salicylate can be suitably used. The concentration of the salicylic acid salt is preferably 1 to 500 g/L, and more preferably 30 to 400 g/L. The pH of the alkaline aqueous solution (alkaline mixed bath) containing the salicylic acid salt and the inorganic alkaline component is preferably 12 to 14, more preferably 12.5 to 13.5.

It is preferable to use a relatively low voltage of 2 to 20 V when the anodizing treatment is performed by using the alkaline mixed bath containing the organic acid salt and the inorganic alkaline component. In the case of using the alkaline mixed bath containing the tartaric acid salt and the inorganic alkaline component, the voltage is preferably 2 to 19 V, more preferably 5 to 17 V, most preferably 7 to 15 V. In the case of using the alkaline mixed bath containing the citric acid salt and the inorganic alkaline component, the voltage is preferably 2 to 19 V, more preferably 3 to 17 V, and most preferably 5 to 15 V. In the case of using the alkaline mixed bath containing the oxalic acid salt and the inorganic alkaline component, the voltage is preferably 2 to 19 V, more preferably 3 to 17 V, and most preferably 5 to 15 V. In the case of using the alkaline mixed bath containing the salicylic acid salt and the inorganic alkaline component, the voltage is preferably 3 to 19 V, more preferably 5 to 17 V, and most preferably 7 to 15 V.

Further, the quantity of electricity during the anodizing treatment is preferably 3 to 50 $C/cm^2$, more preferably 5 to 30 $C/cm^2$ in the case i) of using the inorganic alkaline bath. In the case of using the alkaline mixed bath containing the tartaric acid salt and the inorganic alkaline component, the quantity of electricity is preferably 3 to 50 $C/cm^2$, more preferably 5 to 30 $C/cm^2$. In the case of using the alkaline mixed bath containing the citric acid salt and the inorganic alkaline component, the quantity of electricity is preferably 3 to 50 $C/cm^2$, more preferably 5 to 30 $C/cm^2$. In the case of using the alkaline mixed bath containing the oxalic acid salt and the inorganic alkaline component, the quantity of electricity is preferably 3 to 50 $C/cm^2$, more preferably 5 to 30 $C/cm^2$. In the case of using the alkaline mixed bath containing the salicylic acid salt and the inorganic alkaline component, the quantity of electricity is preferably 5 to 70 $C/cm^2$, more preferably 7 to 50 $C/cm^2$.

The bath temperature of the alkaline mixed bath is, as in the case i) of using the inorganic alkaline bath, preferably 0 to 20° C., more preferably 0 to 15° C., and most preferably 5 to 10° C. The treatment time of the anodizing treatment is preferably 5 to 40 minutes, more preferably 7 to 20 minutes.

(2) Second Step (A 02: Fluororesin Coating Treatment)

The second step (S 02) is a step for applying the fluororesin coating layer 6 to the surface of the anodized film 4 formed by the anodizing treatment.

The fluororesin coating treatment to be carried out in the second step (S 02) is to coat the surface of the support frame 1 for pellicle on which the anodized film 4 is formed with the fluororesin paint by spray coating or the like. The conditions of the heat treatment (drying treatment, baking treatment, or the like) after the application of the fluororesin paint are not particularly limited as long as the effects of the present invention are not impaired, and may be appropriately adjusted depending on the desired film thickness and quality and the like of the fluororesin coating layer 6, and for example, there can be used the treatment conditions at 280° C. for 60 minutes.

(3) Other Steps

In the method of manufacturing the support frame for pellicle of the present invention, it is preferable to further include a coloring step for adjusting a lightness index *L value by at least one of pigmentation, natural coloring and electrolytic coloring. The coloring method using pigmentation, natural coloring and electrolytic coloring is not particularly limited as long as the effects of the present invention are not impaired, and various conventionally known coloring methods can be used.

When lowering the lightness index *L value of the support frame 1 for pellicle by blackening, it is possible to obtain the support frame for pellicle which is easy to prevent scattering of exposure light and to perform a foreign particle non-adhesion inspection before use. Here, from the viewpoints of prevention of scattering of exposure light and inspection of adhesion of foreign substances before use, it is preferable to adjust the lightness index *L value to 50 or less by blackening.

For blackening of the support frame 1 for pellicle, for example, though there can be used dyeing, pigmentation, natural coloring, electrolytic coloring or the like, in the case of using an organic dye, when high energy light is irradiated on the support frame for pellicle, there is a possibility that color tone change and discoloration may occur due to chemical change of the organic dye. Therefore, from the viewpoint of obtaining light resistance, it is preferable to use the pigmentation, natural coloring, electrolytic coloring and the like.

3. Pellicle

Figure 2:
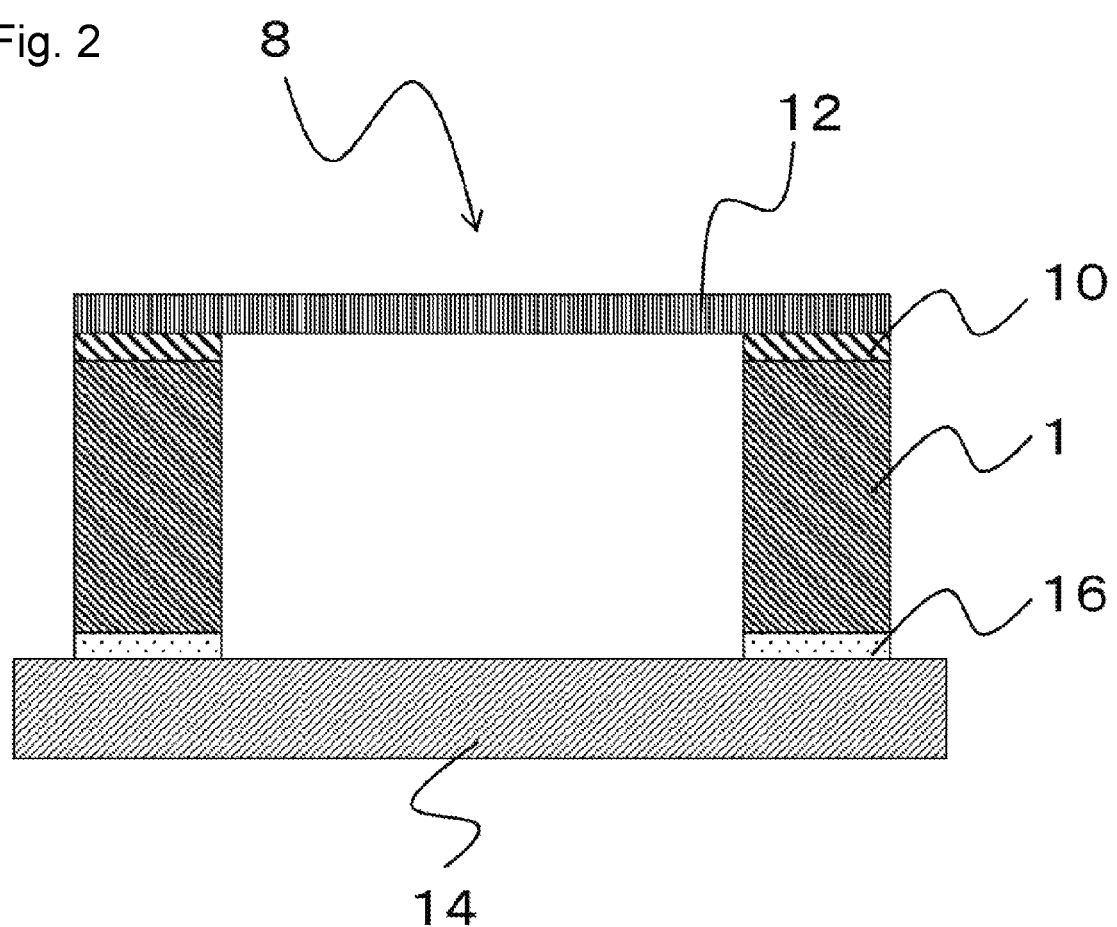
FIG. 2 is a schematic cross-sectional view showing one example of the pellicle which is composed by using the pellicle frame of the present invention.
Figure 3:
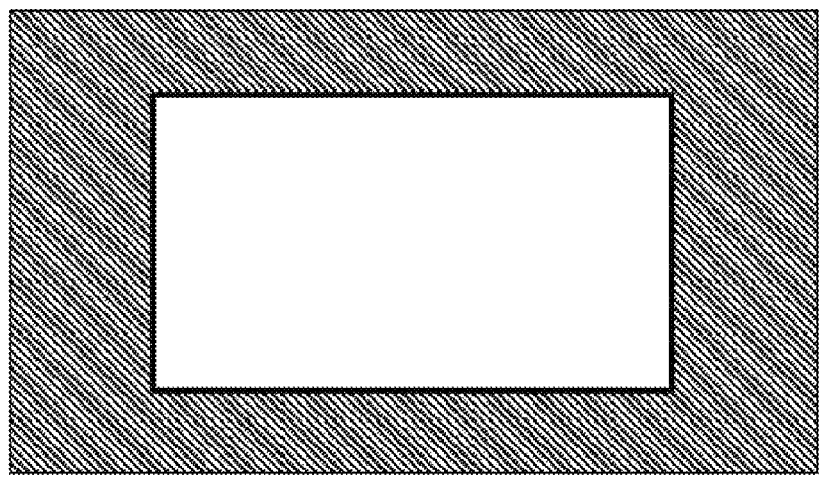
FIG. 3 is a schematic plan view showing one example of the pellicle frame of the present invention.
Figure 3:

A schematic sectional view of one example of the pellicle of the present invention constituted by using the support frame for pellicle of the present invention and a schematic plan view of the support frame for pellicle of the present invention are shown in FIG. 2 and FIG. 3, respectively. The pellicle 8 is obtained by stretching and mounting a pellicle film 12 on the upper end surface of the support frame 1 for pellicle via an adhesive layer 10 for mounting the pellicle film. When using the pellicle 8, a pressure sensitive adhesive layer 16 for adhering the pellicle 8 to the photomask (mask or reticle) 14 is formed on the lower end surface of the support frame 1 for pellicle, and a liner (not shown) is peelably adhered to the lower end surface of the pressure sensitive adhesive layer 16.

The representative embodiments of the present invention have been described above, but the present invention is not limited only to these embodiments, and various design changes are possible, and all such design changes are included in the technical scope of the present invention.

EXAMPLES

Example 1

A frame member with a frame shape having outer dimensions of 148.85 mm×114.85 mm×thickness 3.0 mm made of JIS A 7075 aluminum alloy (JIS A 7075-T 6) which was treated according to the temper designation T6 shown in JIS H 0001 was subjected to the anodizing treatment, and thereafter, a liquid fluororesin paint containing tetrafluoroethylene-perfluoroalcoxyethylene copolymer resin (PFA) was applied by spray coating to form a fluororesin coating layer having a thickness of 0.5 to 20 μm to obtain a present support frame 1 for prllicles. The anodizing treatment was carried out in an anodizing bath of an alkaline aqueous solution (pH=14) where 1 wt % of sodium hydroxide (NaOH) was dissolved, at an electrolytic voltage of 20 V and at a bath temperature of 10° C. for 30 minutes. The baking treatment was carried out under the condition of 380° C. for 20 minutes.

Example 2

By spray-coating a powder paint of a fluororesin containing ethylene-tetrafluoroethylene copolymer resin (EFEP) on a frame member which was subjected to the same anodizing treatment as that of Example 1, a fluororesin coating layer having a thickness of 0.5 to 20 μm was formed to obtain a present support frame 2 for pellicle. The baking treatment was carried out under the condition of 220° C. for 30 minutes.

Example 3

After subjecting the surface of the frame member which was the same as that of Example 1 to the anodizing treatment by using an alkaline aqueous solution containing tartaric acid, by spray-coating a powder paint of a fluororesin containing tetrafluoroethylene-perfluoroalkoxyethylene copolymer resin (PFA), a fluororesin coating layer having a thickness of 0.5 to 20 μm was formed to obtain a present support frame 3 for pellicle. The conditions for the baking treatment of the fluororesin coating layer were also the same as in Example 1.

Example 4

By spray-coating a liquid paint of a fluororesin containing tetrafluoroethylene-hexafluoropropylene copolymer resin (FEP) on a frame member which was subjected to the same anodizing treatment as that of Example 3, a fluororesin coating layer having a thickness of 0.5 to 20 μm was formed to obtain a present support frame 4 for pellicle. The conditions for the baking treatment of the fluororesin coating layer were also the same as in Example 1.

Comparative Example 1

A frame member which was subjected to the same anodizing treatment as that of Example 1 was colored by natural coloring to obtain a comparative support frame 1 for pellicle. The comparative support frame 1 for pellicle is not subjected to the fluororesin coating treatment.

Comparative Example 2

A comparative support frame 2 for pellicle was obtained in the same manner as in Example 4 except that the fluororesin coating treatment was not applied.

[Evaluation]

The ion elution amounts of the present support frames 1 to 4 for pellicle and the comparative support frames 1 to 2 were evaluated. Specifically, the support frame for pellicle was placed in a polyethylene bag, 100 ml of pure water was added thereto, and then the bag was sealed to immerse the frame for 4 hours at 80° C. The extracted water from which the eluted component from the support frame for pellicle was extracted was analyzed with an ion chromatographic analyzer (ICS-2100 available from Thermo Fisher Scientific Co., Ltd.) at 1.5 ml/minute under a cell temperature of 35° C., and a column (IonPacAS 11-HC) temperature of 40° C.

Detecting acetate ion, formate ion, hydrochloride ion, nitrite ion, nitrate ion, sulfate ion, oxalate ion, phosphate ion and ammonium ion from the above extracted water, the elution concentrations in 100 ml of pure water per 100 $cm^2$ of the surface area of the present support frame for pellicle were obtained. The obtained results are shown in Table 1. The limit of quantitation (lower limit) of the ion chromatograph analyzer used for the evaluation varies depending on ion species, and it is 0.01 to 0.001 ppm. The unit in each numerical value in Table 1 is ppb, and "0" means that the ionic species was not quantified.

TABLE 1

|  | Acetate ion | Formate ion | Chlorine ion | Nitrite ion | Nitrate ion | Sulfate ion | Oxalate ion | Phosphate ion | Ammonium ion |
|---|---|---|---|---|---|---|---|---|---|
| Ex. 1 | 2 | 1 | 1 | 0 | 0 | 0 | 0 | 0 | 0 |
| Ex. 2 | 3 | 1 | 0 | 0 | 0 | 0 | 0 | 0 | 1 |
| Ex. 3 | 10 | 1 | 0 | 0 | 0 | 0 | 0 | 0 | 1 |
| Ex. 4 | 23 | 0 | 0 | 0 | 1 | 0 | 0 | 0 | 3 |
| Com. Ex. 1 | 46 | 7 | 16 | 0 | 0 | 0 | 0 | 0 | 4 |
| Com. Ex. 2 | 60 | 3 | 3 | 14 | 3 | 0 | 0 | 0 | 5 |

As shown in Table 1, it can be confirmed that the ion elution amounts in the present support frames 1 to 4 for pellicle which are the support frames for pellicle of the present invention is extremely small (Examples 1 to 4). To the contrary, in the comparative support frames 1 and 2 for pellicle having the anodized film 4 as the outermost layer, particularly large amounts of acetate ion eluted (Comparative Examples 1 and 2). As is clear from these data, clear differences in ion elution amount were confirmed between the support frames 1 to 4 for pellicle which were subjected to the fluororesin coating treatment and the comparative support frames 1 and 2 for pellicle.

The lightness index L* values based on Hunter's color difference formula of the present support frames 1 to 4 for pellicle and the comparative support frames 1 to 2 for pellicle were measured. The obtained results are shown in Table 2. It is clear that the lightness index L* values of the present support frames 1 to 4 for pellicle are all 60 or less.

TABLE 2

|  | Ex. 1 | Ex. 2 | Ex. 3 | Ex. 4 | Com. Ex. 1 | Com. Ex. 2 |
|---|---|---|---|---|---|---|
| L value | 29.2 | 26.1 | 52.3 | 51.5 | 30.0 | 33.7 |

EXPLANATION OF SYMBOLS

1: Support frame for pellicle,
2: Frame member,
4: Anodized film,
6: Fluororesin coating layer,
8: Pellicle,
10: Adhesive layer 10 for mounting the pellicle film,
12: Pellicle film,
14: Photomask,
16: Pressure sensitive adhesive layer.

The invention claimed is:

1. A support frame for pellicle, the support frame comprising:
    a frame member comprising aluminum or aluminum alloy; and
    a fluororesin coating layer formed on the surface of the frame member.

2. The support frame for pellicle according to claim 1, wherein the support frame comprises:
    the frame member,
    an anodized film formed on the surface of the frame member, and
    the fluororesin coating layer formed on the surface of the anodized film.

3. The support frame for pellicle according to claim 1, wherein a lightness index *L value of the support frame is 60 or less by blackening.

4. The support frame for pellicle according to claim 1, wherein the frame is colored by at least one of dyeing pigmentation, natural coloring and electrolytic coloring.

5. The support frame for pellicle according to claim 1, wherein, in ion elution test for measuring concentration of an ion eluted by immersing the frame in pure water at 80° C. for 4 hours, elution concentration of acetate ion to 100 ml of pure water per 100 $cm^2$ of the surface area is 0.2 ppm or less, elution concentration of formate ion is 0.2 ppm or less, elution concentration of oxalate ion is 0.2 ppm or less, elution concentration of sulfate ion is 0.1 ppm or less, elution concentration of nitrate ion is 0.2 ppm or less, elution concentration of nitrite ion is 0.2 ppm or less, elution concentration of chlorine ion is 0.2 ppm or less, elution concentration of phosphate ion is 0.1 ppm or less, and elution concentration of ammonium ion is 0.1 ppm or less.

6. A method for manufacturing a support frame for pellicle, which comprises:
    a first step for subjecting a frame member comprising aluminum or aluminum alloy to an anodizing treatment, and
    a second step for applying a fluororesin coating to the surface of an anodized film formed by the anodizing treatment.

7. The method for manufacturing a support frame for pellicle according to claim 6, which further comprises:
    a coloring step for adjusting a lightness index *L value of the support frame by at least one of dyeing pigmentation, natural coloring and electrolytic coloring.

8. The method for manufacturing a support frame for pellicle according to claim 6, wherein the lightness index *L value is adjusted to 60 or less by blackening.

9. A pellicle comprising
    the support frame for pellicle according to claim 1, and
    a pellicle film supported by the support frame for pellicle.

* * * * *